US006952174B2

(12) United States Patent
Madsen et al.

(10) Patent No.: US 6,952,174 B2
(45) Date of Patent: Oct. 4, 2005

(54) SERIAL DATA INTERFACE

(75) Inventors: Jesper Steensgaard Madsen, Carlsbad, CA (US); Shouri Chatterjee, New York, NY (US); Per Arne Lagervall, Carlsbad, CA (US)

(73) Assignee: Microsemi Corporation, Irvine, CA (US)

( * ) Notice: Subject to any disclaimer, the term of this patent is extended or adjusted under 35 U.S.C. 154(b) by 324 days.

(21) Appl. No.: 10/237,992

(22) Filed: Sep. 9, 2002

(65) Prior Publication Data

US 2003/0223502 A1 Dec. 4, 2003

Related U.S. Application Data

(60) Provisional application No. 60/318,457, filed on Sep. 10, 2001, and provisional application No. 60/318,229.

(51) Int. Cl.[7] .......... H03M 7/46
(52) U.S. Cl. .......... 341/63; 341/67
(58) Field of Search .......... 341/50, 51, 63, 341/67; 710/61, 58, 305, 400; 381/314, 312, 315, 323

(56) References Cited

U.S. PATENT DOCUMENTS 4,553,130 A * 11/1985 Kato .......... 341/67
5,495,242 A 2/1996 Kick et al.
5,500,902 A 3/1996 Stockham, Jr. et al.
5,515,443 A 5/1996 Meyer
5,710,819 A 1/1998 Topholm et al.
5,748,684 A * 5/1998 Sanchez .......... 375/357
5,815,102 A 9/1998 Melanson
5,838,801 A 11/1998 Ishige et al.
6,023,517 A 2/2000 Ishige
6,058,197 A 5/2000 Delage
6,229,459 B1 * 5/2001 Noda .......... 341/59
6,240,193 B1 * 5/2001 Green .......... 381/314
6,668,292 B2 * 12/2003 Meyer et al. .......... 710/61

FOREIGN PATENT DOCUMENTS

EP 0 308 194 A2 3/1989
EP 0 569 989 A2 11/1993

OTHER PUBLICATIONS

Magrath, A.J. et al; "Design and Implementation of A FPGA Sigma–Delta Power DAC", IEEE Workshop on Leicester, UK Nov. 3–5, 1997 Signal Processing Systems, 1997 pp. 511–521.

Ramprasad, Sumant, et al; "A Coding Framework for Low–Power Address and Data Busses" IEEE Transactions on Very Large Scale Integration (VLSI) Systems, pp. 212–221, no date given.

* cited by examiner

*Primary Examiner*—Brian Young
(74) *Attorney, Agent, or Firm*—Jackson Walker L.L.P.; Michael Cameron, Esq.; Robert Klinger, Esq.

(57) ABSTRACT

A method of encoding a first stream of digital signal data words is provided. A most recent value of the first stream of digital signal data words is received and memorized. A previous value of the first stream of digital data words is received and memorized. The most recent and the previous values of the stream of digital data words are combined to create a second data stream. The words are converted in the second data stream into a serial representation. The serial representation is transmitted on a single wire interface.

30 Claims, 6 Drawing Sheets

SERIAL DATA INTERFACE

PRIORITY CLAIM

This application claims priority of U.S. Provisional Patent Application No. 60/318,229 filed on Sep. 7, 2001, entitled "Serial Data Interface," and U.S. Provisional Patent Application No. 60/318,457 filed on Sep. 10, 2001, entitled "Serial Data Interface", the teachings are incorporated herein by reference.

TECHNICAL FIELD

The present invention relates to electrical circuit interfaces and, more specifically, to encoding signals for low-power serial transmission over a single-wire interface.

BACKGROUND OF THE INVENTION

Digital data is transmitted via serial interfaces in a great number of applications, for example, an Ethernet, a digital telephone system, and various digital audio systems. Power consumption is typically a very important parameter in portable applications, such as, for example, hearing aids. FIG. 1 shows the main components of a digital hearing aid 50. In this example, microphone 52 receives an acoustic wave and transforms the acoustic wave into an analog electrical signal. Analog-to-digital converter (ADC) 54 converts the analog electrical signal into digital form. Digital signal processor (DSP) 56 processes the digital signal according an audiologist's prescription. Then digital driver 58 converts the processed digital signal into an acoustic wave directed toward a patient's ear. Microphone 52, shown in FIG. 2, is generally a capacitive type microphone. Small metal container 62 is sealed on one side (not necessarily an air-tight seal) by conductive membrane 60 which is deflected when an acoustic wave applies force upon the conductive membrane. Conductive membrane 60 and metal container 62 are electrically isolated from one another, and the two-terminal system represents a capacitive structure. An electrical field exists between the two capacitive plates, i.e., between conductive membrane 60 and metal container 62, and a time varying electrical voltage signal is thus created between the two plates when conductive membrane 60 vibrates. This produced electrical signal can provide only a small amount of power, and is therefore sensitive to electrical noise and other disturbances. The metal container is generally connected electrically to the system's ground, for example, a battery's negative terminal. A cavity inside metal container 62 is thereby, to a large extent, shielded from interference from unwanted electrical fields that may surround microphone 52. A small integrated circuit (not shown) located inside metal container 62 amplifies the signal before the signal leaves the shielded environment. In advanced products, the signal is not only amplified, but also analog-to-digital (A/D) converted inside metal container 62. The advantage of this procedure is that digital signals are virtually immune to noise interference, and hence can be routed outside metal container 62 without any loss of performance. Subsequent digital signal processing implemented by DSP circuit 56 should preferably be located outside metal container 62, i.e., the digital signal processing should be separated from noise sensitive circuits near microphone 52.

FIG. 3 shows a system-level electrical schematic of a digital hearing aid where the ADC 54 is placed inside the microphone's metal container 62. The microphone is electrically represented by voltage source 64 with a capacitive output impedance. Inside the shielding metal container are buffer circuit 66, A/D converter 54, and transmitter 68. The system in FIG. 3 further comprises receiver 72, DPS circuit 56, digital driver 58, clock generator 78, and battery 74.

However, such a system suffers various shortcomings which are associated with such data interfaces. Specifically, the small physical size of metal container 62 limits the number of wires that can be used to connect the metal container to other elements in the hearing aid. A typical requirement is that the information-carrying signal be transmitted over single wire interface 76. The physical dimensions of interface 76, however, are far greater than those characteristic of interconnections between circuit blocks on a monolithic integrated circuit Hence, the interface is subject to a substantial capacitive load 70 to ground. Capacitive load 70 is highly undesirable because this substantial capacitive load will cause the transmitter to drain a substantial amount of energy from battery 74 every time interface 76 is charged from a low voltage to a higher voltage. Transmitter 68 will thus consume a significant amount of power if interface 76 is carrying a high bit rate. Therefore, it would be advantageous to have a method and system to substantially reduce the power consumption of the transmitter that will substantially reduce the power consumption without any loss of data.

SUMMARY OF THE INVENTION

The present invention achieves technical advantages as an encoding/decoding system that substantially reduces the power required to communicate digital data over a serial interface with an appreciable capacitive load. A novel and improved way to design and operate a transmitter and receiver is disclosed.

According to one aspect of the present invention, a serial interface is provided with a reduced power consumption.

According to another aspect of the present invention, a serial interface is provided for use in portable applications, such as, for example, hearing aids.

According to a further aspect of the present invention, a serial interface is provided that is optimized for data being transmitted.

According to a further aspect of the present invention, a serial interface is provided that automatically synchronizes during normal operation.

According to a further aspect of the present invention, a serial interface is provided which does not require a phase locked loop (PLL) for clock synchronization.

Further advantages will become apparent from a consideration of the ensuing description, drawings and claims.

BRIEF DESCRIPTION OF THE DRAWINGS

For a better understanding of the invention including its features, advantages and specific embodiments, reference is made to the following detailed description along with accompanying drawings in which.

References in the detailed description correspond to like references in the figures unless otherwise noted.

DETAILED DESCRIPTION OF PREFERRED EMBODIMENTS

While the making and use of various embodiments of the present invention are discussed in detail below, it should be appreciated that the present invention provides applicable inventive concepts which can be embodied in a wide variety of specific contexts.

Figure 1:
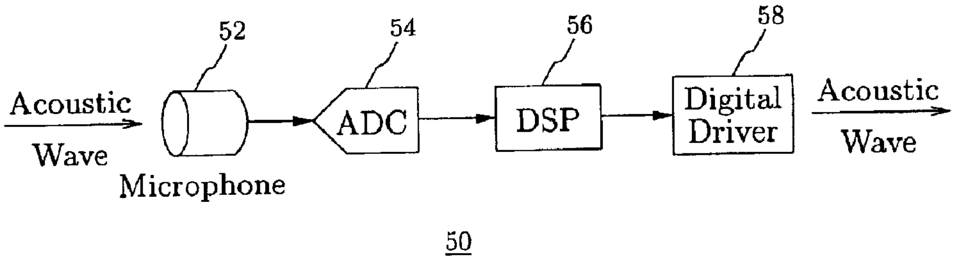
Figure 1 (PRIOR ART)
FIG. 1 is an illustration of the main components of a digital hearing aid.
Figure 2:
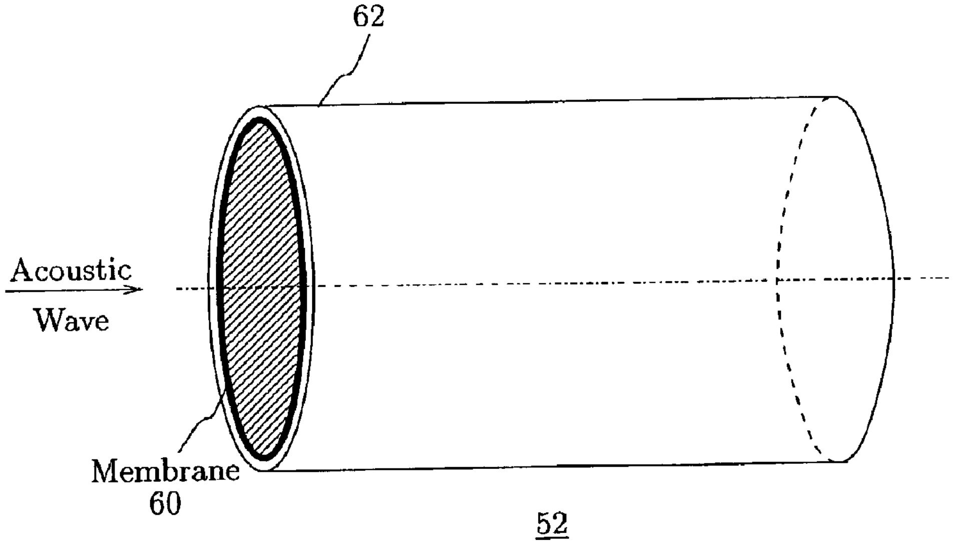
Figure 2 (PRIOR ART)
FIG. 2 is an illustration of a microphone in greater detail.
Figure 3:
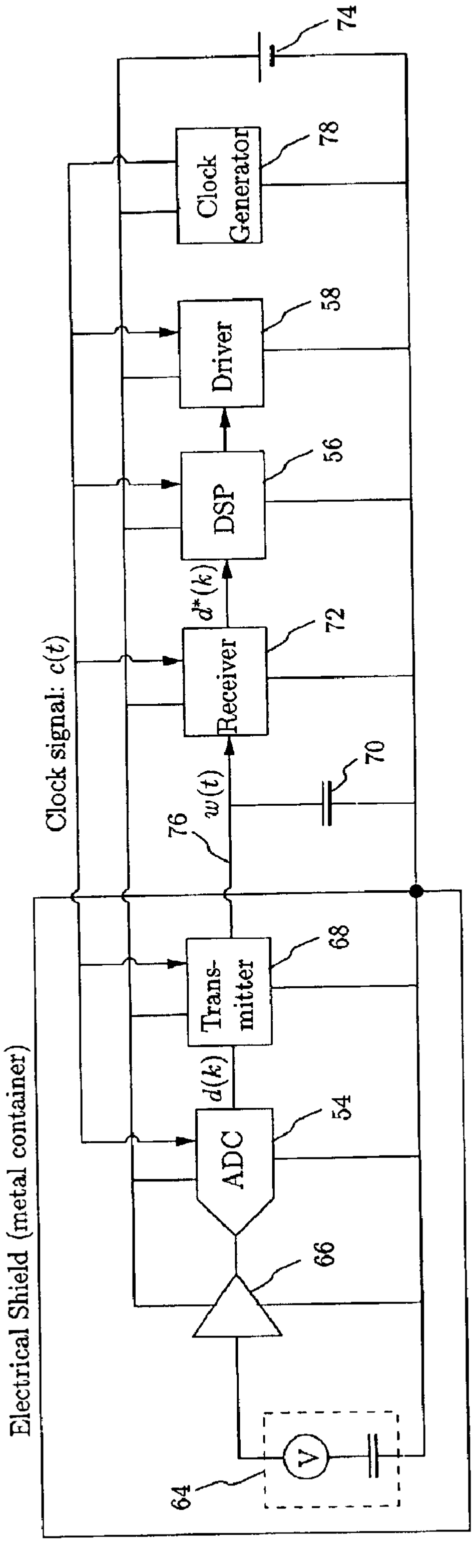
FIG. 3 is an illustration of a system-level schematic of a digital hearing aid where an ADC is placed inside the microphone's metal container.

One embodiment of the present invention is a serial interface that encodes data according to a specific application, such as the application shown in FIG. 3. A/D converter 54 is based on a delta-sigma principle. The A/D converter produces a stream of low resolution words, i.e., a sequence of codes each representing a numerical value, at a rate which is substantially higher than the Nyquist rate, ie., twice the signal's bandwidth. In this embodiment, the digital word rate (sampling frequency) is 2 MHz although the signal bandwidth is only 10 kHz. In other words, the over sampling ratio (OSR) may be expressed as:

$$OSR = \frac{2\text{ MHz}}{2 \times 10\text{ kHz}} = 100$$

Delta-Sigma A/D converters generally produce digital words of very low resolution. Sometimes the resolution of the words is only one bit i.e., each word has one of only two possible numerical values, in which case transmitter 68 in FIG. 3 could be a simple digital buffer circuit. Transmitter 68 may consume significant power in charging and discharging capacitive load 70 if such a single-bit data stream were to be transmitted directly on the interface 76. In this embodiment, however, delta-sigma ADC 54 advantageously produces digital words each with a resolution of two bits. In other words, ADC 54 produces a stream of data words in which each data word may have one of four predefined numerical values. Hence, in each clock cycle, one of four codes (code-0, code-1, code-2, or code-3) may be transmitted over interface 76 while the signal has only two valid voltage levels.

Figure 4:
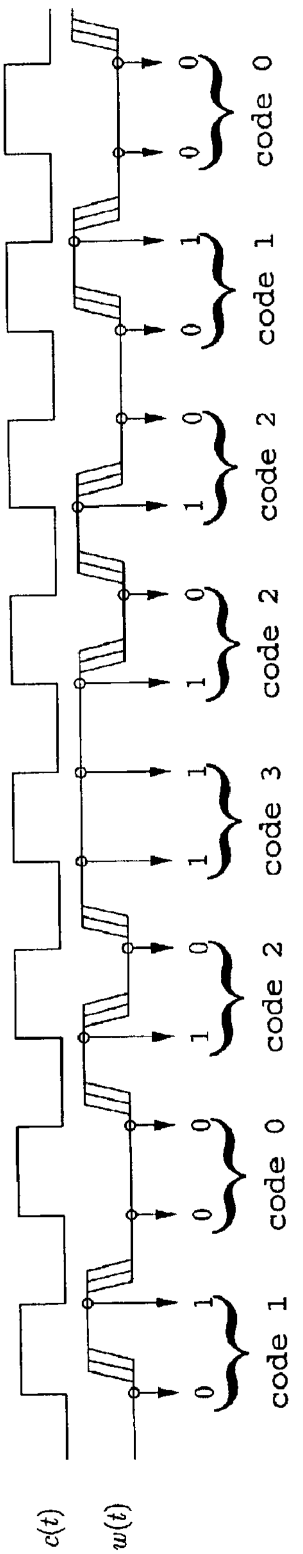
FIG. 4 is a an illustration of how codes are deciphered from a voltage signal applied to the interface by the transmitter in accordance with the present invention.

FIG. 4 shows how the codes are deciphered from a voltage signal w(t) applied to interface 76 by the transmitter 68 in accordance with the present invention. Receiver 72 detects a logical value (high/low voltage levels are respectively interpreted as logical values 1/0) of w(t) at both a rising and falling edge of a clock signal c(t). For example, if w(t) is low at the rising edge of c(t) and w(t) is high at the falling edge of c(t), the receiver interprets the data as a message corresponding to code-1 (code "01"). The table below lists how the four codes are represented and interpreted.

| Value of w(t) at the rising edge of the clock signal c(t) | Value of w(t) at the faing edge of the clock signal c(t) | Interpreted as |
|---|---|---|
| low or "0" | low or "0" | code-0 or "00" |
| low or "0" | high or "1" | code-1 or "01" |
| high or "1" | low or "0" | code-2 or "10" |
| high or "1" | high or "1" | code-3 or "11" |

In this conventionally designed interface, the four codes represent each one of the four numerical values that the digital signal d(k) is composed of. Receiver 72 then simply translates the received codes to the corresponding numerical values and communicates that translation to DSP circuit 56. This conventional approach, however, implies that transmitter's 68 power consumption will be relatively high. This implication is a consequence of the nature of the signal d(k) produced by delta-sigma ADC 54: even for constant input signals, d(k) will constantly fluctuate between two or more numerical values. The corresponding frequent fluctuation between codes implies that interface 76, with the interface's 76 capacitive load 70, will be charged and discharged frequently. This frequent charging and discharging of the interface's capacitive load 70 is associated with a relatively high power consumption.

To reduce the power consumption, the present invention advantageously encodes d(k) in a different manner, such as to reduce the frequency at which the interface 76 is charged and discharged.

ADC 54 produces a data stream d(k) which may be composed exclusively of the following numerical values: (+8), (+1), (−1), and (−8). It is particularly important to note at this point that the power consumption is small when the input signal is small, i.e., when the hearing aid, for example, is used in a relatively quiet environment. This type of use for the hearing aid is generally the case for more than 90% of the time the hearing aid is in operation. For such small signals, conventional delta-sigma ADCs tend to produce signals d(k) which quantitatively maybe of the type:

d(k)= . . . , (+1), (−1), (+1), (−1), (+1), (−1) , (−1), (+1), (−1), (+1), (−1), (+1)(−1), . . .

In other words, the signal d(k) primarily alternates between the numerical values of (+1) and (−1) in between short sequences of constant (+1) or (−1). The sequences of identical values are rarely more than 2 or 3 samples long. Based on this observation, to reduce the power consumption, the present invention advantageously includes transmitter 68 designed to generate a code "00" every time the signal transitions either from (+1) to (−1) or from (−1) to (+1). If a (+1) follows a (+1), or a (−1) follows a (−1), transmitter 68 produces the code "11". Hence, for the above data sequence, the transmitter produces the following sequence of codes:

. . . , ??, 00, 00, 00, 00, 00, 11, 00, 00, 00, 00, 00, 00, 11, 00, . . .

Interface 76 is charged and discharged much less frequently than if conventional encoding (where each code represents a specific numerical value) was used. As a result, the power consumption is reduced substantially.

Receiver 72 is able to reconstruct the signal d*(k)=d(k). Observe that two different signals:

$d_1$(k)= . . . , (+1), (−1), (+1), (−1), (+1), (−1), (−1), (+1), (−1), (+1), (−1), (+1), (−1), (−1), . . . and $d_2$(k)= . . . , (−1), (+1), (−1), (+1), (−1), (+1), (+1), (−1), (+1), (−1), (+1), (−1), (+1), (+1), . . .

will produce the same sequence of codes mentioned above. In other words, receiver 72 will not inherently be able to detect the polarity of the signal, the receiver 72 would only be able to guarantee d*(k)=±d(k). In some applications, the absolute phase is arbitrary (in which case this encoding scheme would be splendid), whereas it is of crucial importance in other applications, such as in directional hearing aids, for example.

Correct phase can be guaranteed if transmitter 68 and receiver 72 are synchronized by some sort of reset event. According to the present invention, such a reset event advantageously occurs relatively frequently to assure satisfactory performance in the very rare event that a bit error should occur. In this embodiment, synchronization is guaranteed every time d(k) attains a numerical value of either (+8) or (−8).

In practice, transmitter 68 may be implemented as a digital state machine with four possible states: (−8), (−1), (+1), and (+8). The state machine is clocked once every clock cycle. The state machine always transitions to the state that corresponds to the value of d(k) (for simplicity the four states are named according to the value of d(k)). The state machine's operation is described in Table 1, which effectively defines the operation of transmitter 68.

TABLE 1

| Input value D(k) | Previous state d(k − 1) | Now state d(k) | Code Generated w(t) |
|---|---|---|---|
| (−8) | (−8) | (−8) | "01" |
| (−8) | (−1) | (−8) | "01" |
| (−8) | (+8) | (−8) | "01" |
| (−1) | (+8) | (−1) | "01" |
| (−1) | (−8) | (−1) | "00" |
| (−1) | (−1) | (−1) | "11" |
| (−1) | (+1) | (−1) | "00" |
| (−1) | (+8) | (−1) | "00" |
| (+1) | (−8) | (+1) | "11" |
| (+1) | (−1) | (+1) | "00" |
| (+1) | (+1) | (+1) | "11" |
| (+1) | (+8) | (+1) | "11" |
| (+8) | (−8) | (+8) | "10" |
| (+8) | (−1) | (+8) | "10" |
| (+8) | (+1) | (+8) | "10" |
| (+8) | (+8) | (+8) | "10" |
| (+8) | (+8) | (+8) | "10" |

Figure 5:
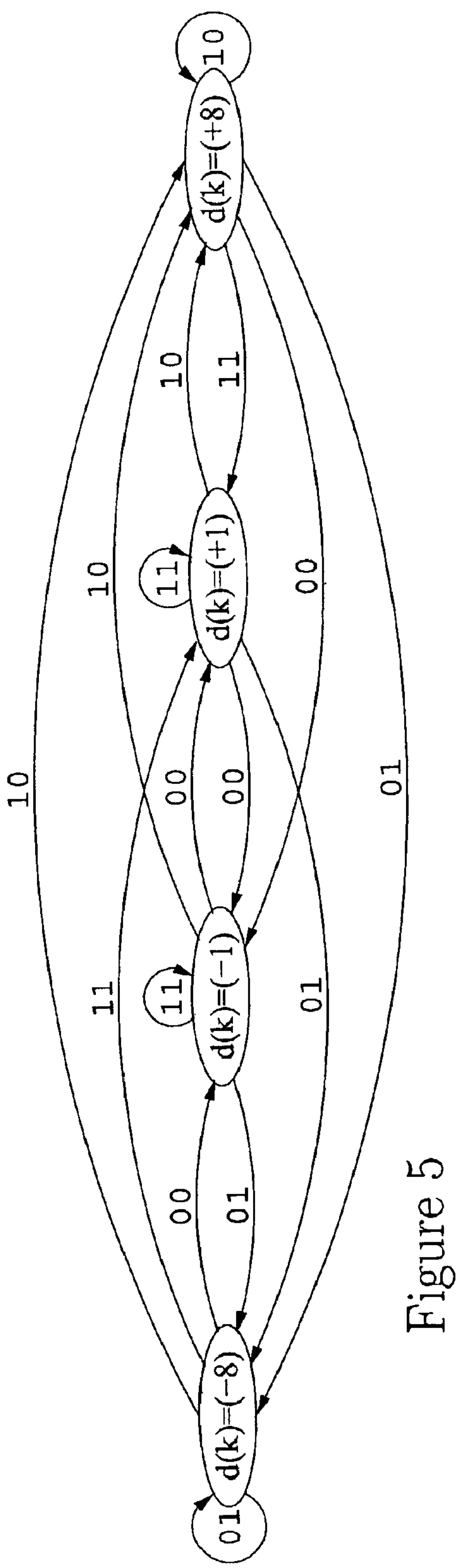
FIG. 5 illustrates the operation of a transmitter in accordance with the present invention.

The operation of transmitter 68 is illustrated in FIG. 5. In this example, each of the four states are represented by an oval. Each arc represents a transition from one state to the next, i.e., starting from d(k−1) and leading to d(k). The annotation of each arc identifies the code that is transmitted. Note that for each state, the transitions to each of the four possible states, new states are associated with each a unique code. Note also that all transitions to the state (−8) will produce the unique code "01", and similarly that all transactions to the state (+8) will produce the unique code "10". The combination of these two properties facilitates robust reconstruction of d(k) on the basis of the transmitted codes.

Receiver 72 is implemented as a state machine. This state machine also has four possible states: (−8), (−1), (+1), and (+8). These states are named according to the corresponding numerical values of the output signal d*(k), which is the anticipated value of d(k). The state machine's operation is described in Table 2, which effectively defines receiver's 72 operation.

TABLE 2

| Code Received w(t) | Previous State d*(k − 1) | New State d*(k) | Output Value d*(k) |
|---|---|---|---|
| "01" | (−8) | (−8) | (−8) |
| "01" | (−1) | (−8) | (−8) |
| "01" | (+1) | (−8) | (−8) |
| "01" | (+8) | (−8) | (−8) |
| "00" | (−8) | (−1) | (−1) |
| "00" | (−1) | (+1) | (+1) |
| "00" | (+1) | (−1) | (−1) |
| "00" | (+8) | (−1) | (−1) |
| "11" | (−8) | (+1) | (+1) |
| "11" | (−1) | (−1) | (−1) |
| "11" | (+1) | (+1) | (+1) |
| "11" | (+8) | (+1) | (+1) |
| "10" | (−8) | (+8) | (+8) |
| "10" | (−1) | (+8) | (+8) |
| "10" | (+1) | (+8) | (+8) |
| "10" | (+8) | (+8) | (+8) |

Figure 6:
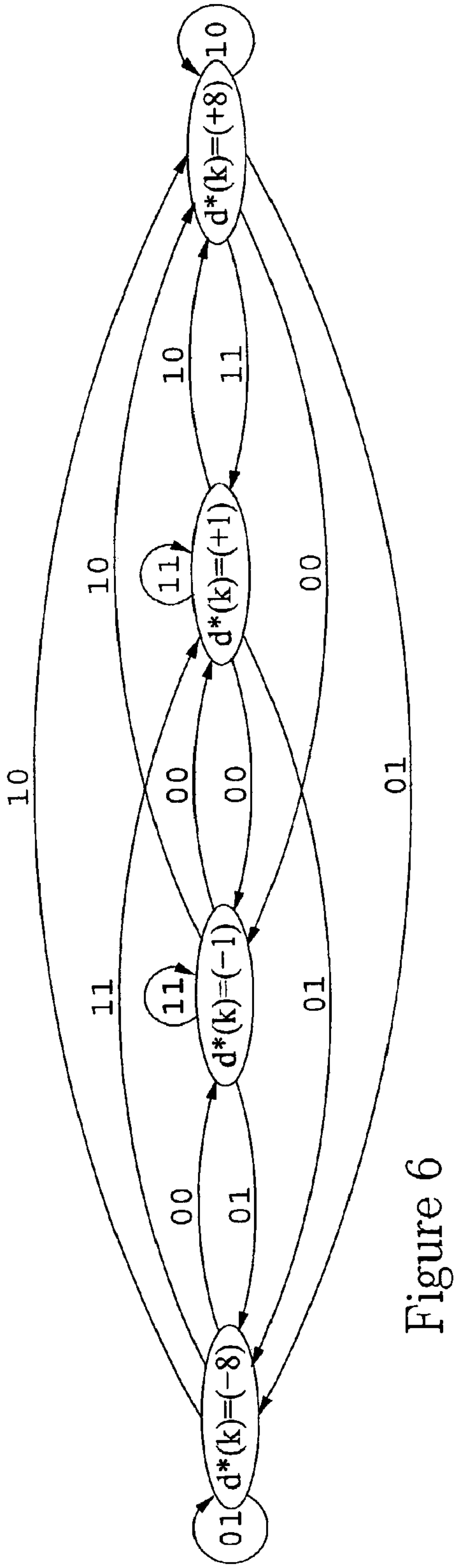
FIG. 6 is an illustration of the operation of a state machine implementing the receiver 72 in accordance with the present invention.

FIG. 6 is an illustration of the operation of a state machine implementing the receiver 72 in accordance with the present invention. In this example, each of the four states are represented by an oval. Each arc represents a transition from one state to the next, i.e., starting from d*(k−1) and leading to d*(k). The annotation of each arc identifies the received code. Note that when receiving code "01", the state machine will always transition to state (−8), i.e., regardless of what the previous state was. Likewise, note that when receiving code "10", the state machine will always transition to state (+8).

Advantageously, according to Table 1 above, transmitter 68 will only generate code "01" when it transitions to state (+8), and likewise, transmitter 68 will only generate code "10" when it transitions to state (−8). Hence, the two state machines implementing respectively transmitter 68 and receiver 72, will synchronize every time d(k) attains a numerical value of either (−8) or (+8). Synchronization will thus take place relatively frequently (which makes the system tolerant to bit errors) without disrupting the normal operation. To obtain immediate synchronization in a power-up situation, it is preferable that the first numerical value of d(k) is forced to be either (+8) or (−8). Once the two state machines are synchronized, they will remain synchronized (which can be seen from Tables 1 and 2).

Gate Level Implementation (Transmitter)

Figure 7:
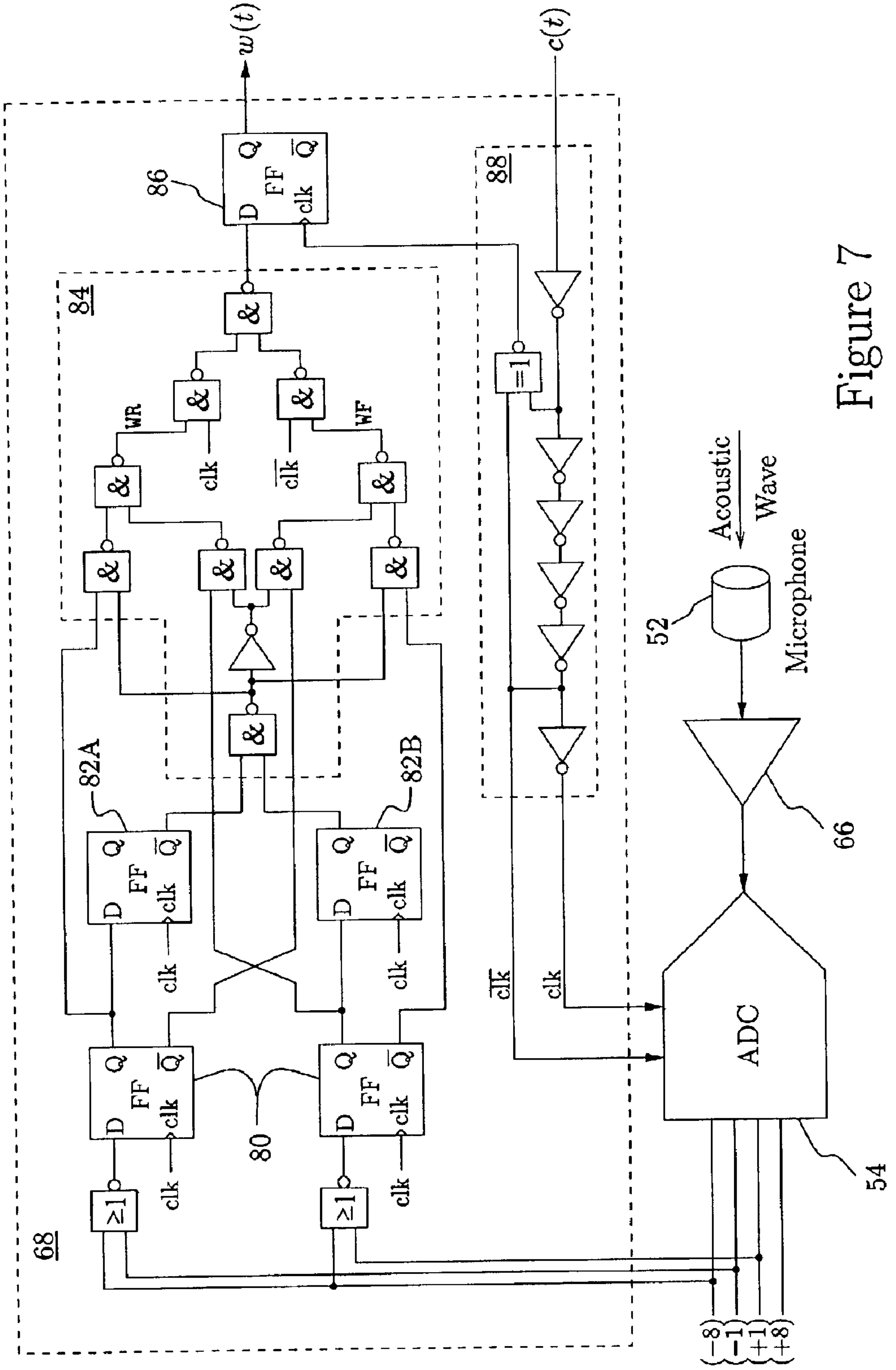
FIG. 7 is an illustration of a gate-level implementation of a transmitter in accordance with the present invention.

FIG. 7 is an illustration of a gate-level implementation of a transmitter 68 in accordance with the present invention. In this example, the digital input signal d(k) provided by ADC 54 is encoded in a "one-of" fashion, where only one line in the 4-bit bus is logically high at any time. A digital code representing d(k) is clocked into a first set of flip-flop circuits 80 slightly after (eg., 6 gate delays) the clock signal's c(t) rising edge. The digital codes "11", "10, "01", and "00" are used to represent the following numerical values for d(k): (+8), (+1), (−1), and (−8). The outputs from the first set of flip-flop circuits 80 are connected directly to the inputs of a second set of flip-flop circuits 82A and 82B which are clocked simultaneously with the first set of flip-flop circuits 80.

The two sets of flip-flop circuits 80, 82A and 82B store 2×2 bit codes representing respectively d(k) and d(k−1). According to Table 1, these four bits of information are sufficient to determine which digital code that should be transmitted on interface 76. The actual encoding is performed by a small network of logic gates 84. Two logical signals WR and WF attain the logical values that the receiver should detect at respectively rising and falling edges of the clock signal c(t). A single bit flip-flop circuit 86 produces the actual output signal waveform w(t). The flip-flop circuit 86 is clocked at every rising and falling edge of c(t). A small edge detecting circuit 88 produces a short duration pulse at each edge of c(t), which is used to clock the flip-flop circuit 86. The output flip-flop circuit 86 will, at the rising edge of c(t), clock in and apply to interface 76 the value generated when c(t) is low, i.e., WF. Similarly, at the falling edge of c(t), the flip-flop circuit 86 will clock in the value generated when c(t) is high, i.e., WR.

Figure 8:
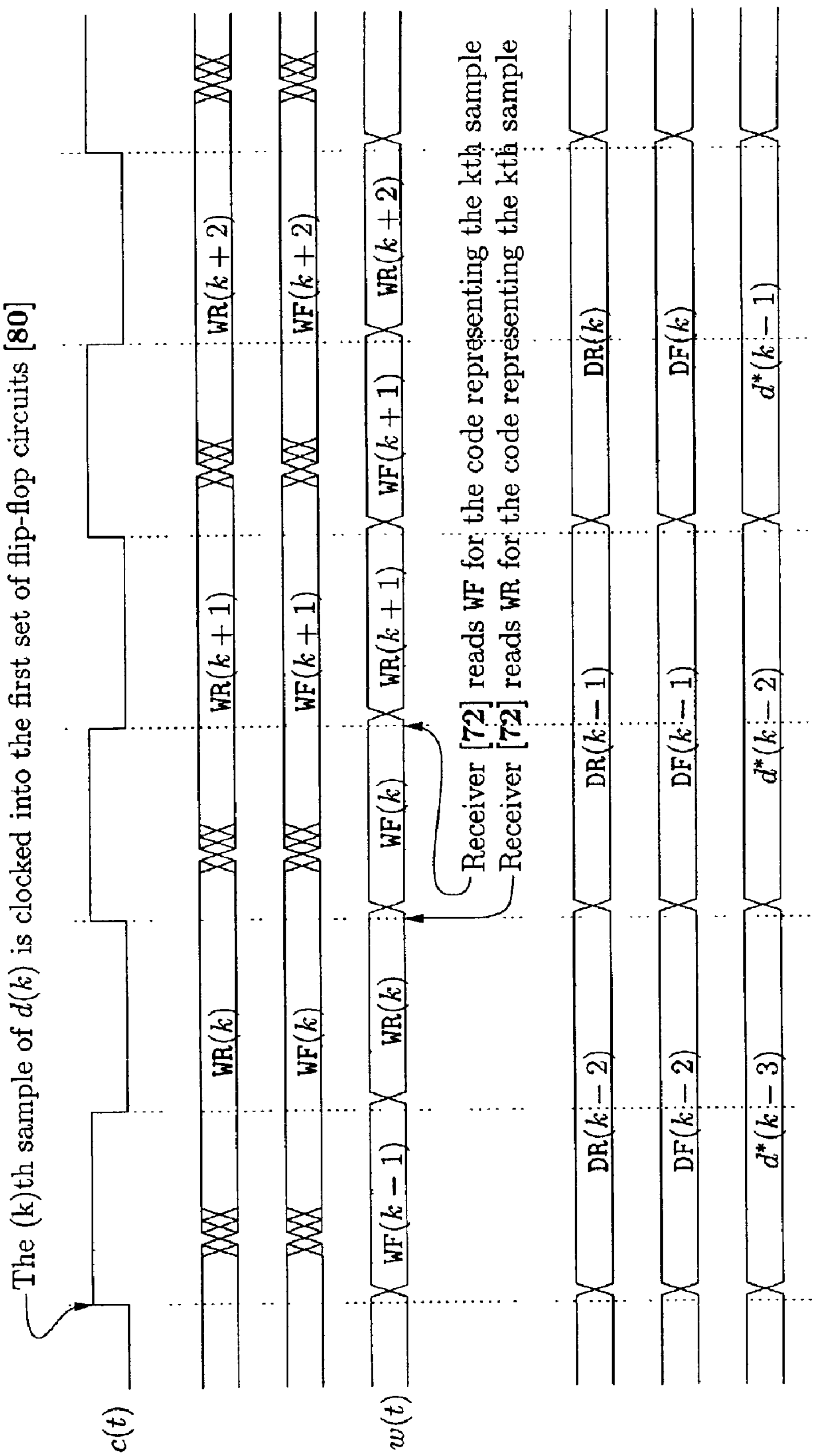
FIG. 8 illustrates a timing diagram for a serial data interface in accordance with the present invention.

FIG. 8 illustrates a timing diagram for a serial data interface in accordance with the present invention. To assure a sufficiently long hold time for the output flip-flop circuit 86, the preceding network of flip-flop circuits 80, 82A, and 82B and logic gates 84 are driven by the delayed clock signals, clk and $\overline{\text{clk}}$. Receiver 72 evaluates the voltage w(t) on interface 76 at the rising and falling edges of c(t). Notice that receiver 72 at any rising edge of c(t) detects the first bit WR(k) in the code representing the sample d(k) that was clocked into the first set of flip-flop circuits 80 one clock cycle earlier. Similarly, receiver 72 will at any falling edge of c(t), detect the second bit WF(k) in the code representing the sample that was clocked into the first set of flip-flop circuits 80 one and one-half clock cycles earlier. A few clock cycles of latency is quite acceptable in an interface for this type of application.

Gate Level Implementation (Receiver)

Figure 9:
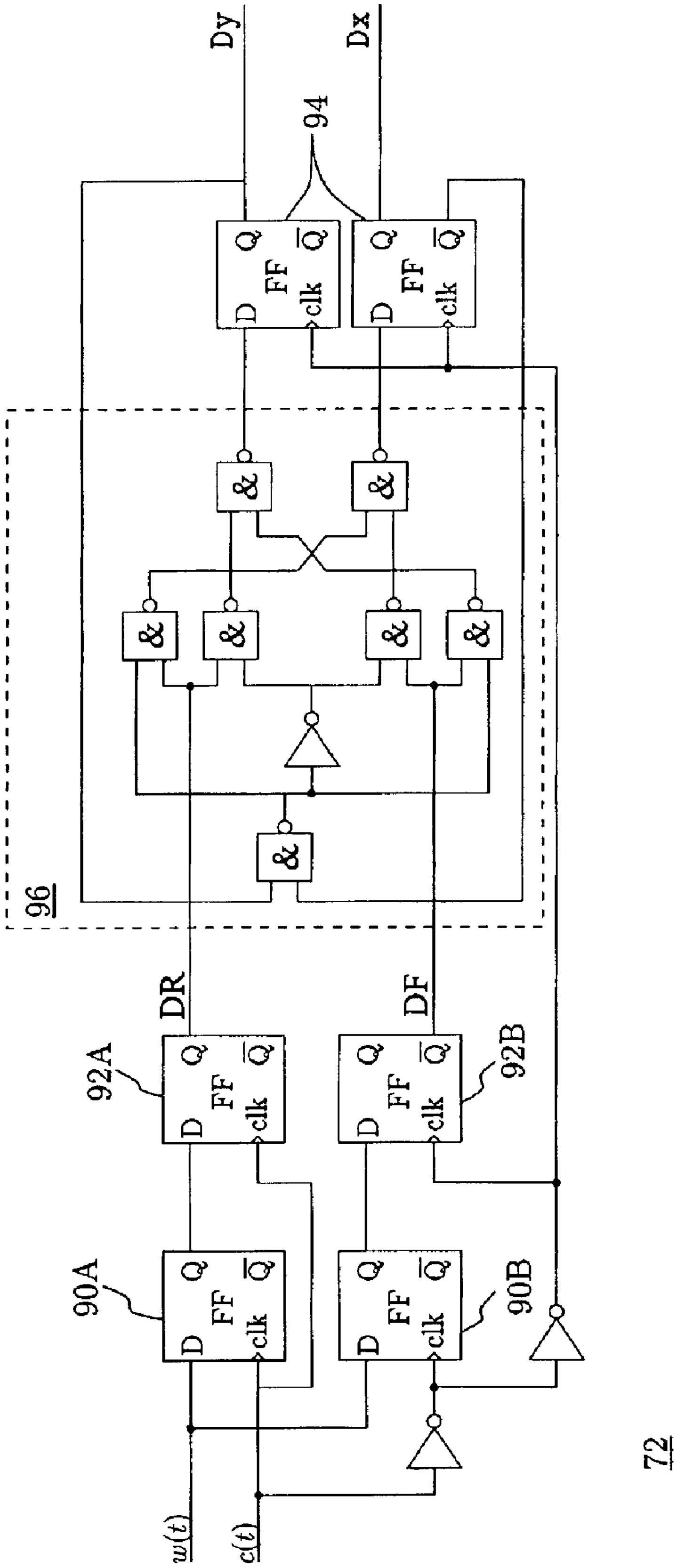
FIG. 9 illustrates a gate level implementation of a receiver in accordance with the present invention.

FIG. 9 illustrates a gate level implementation of a receiver in accordance with the present invention. In this example, a third set of flip-flop circuits 90A and 90B detect and store the logical values of w(t) at respectively the rising and falling edges of c(t). It is important that the third set of flip-flop circuits 90A and 90B are clocked directly by c(t) or by induced clock signals that have a minimum of delay with respect thereto. The inputs of a fourth set of flip-flop circuits 92A and 92B are connected directly to the outputs of the third set of flip-flop circuits 90A and 90B. Accordingly, the two logical signals DR and DF represent the detected logical values of w(t) at respectively the rising and falling edges of c(t). The timing of these signals is shown in FIG. 8. A fifth set of flip-flop circuits 94 stores the output signal, i.e. the expected value d*(k) of d(k). The encoding scheme used for d*(k) is shown in Table 3.

TABLE 3

| Dx | Dy | d*(k) |
|---|---|---|
| “0” | “0” | (−8) |
| “0” | “1” | (−1) |
| “1” | “0” | (+1) |
| “1” | “1” | (+8) |

According to Table 2, the state machine's next state and output value d*(k) is a function of the received code and the previous state d*(k−1). These four bits of information are stored in the flip-flop circuits 92A, 92B and 94. A small network of logic gates 96 perform the necessary decoding, as described by Table 2, and the new state and output value d*(k) is clocked into the flip-flop circuits 94 at the rising edges of c(t). FIG. 8 shows the overall timing diagram.

Performance Evaluation

The described embodiment of the present invention has been designed and simulated extensively. This embodiment's operation is very robust and no errors were detected.

To evaluate the encoding scheme's efficiency, a comparison was made to a traditional serial interface where each of the possible values of d(k) are assigned a specific code transmitted on the interface. The results are summarized in Table 4.

TABLE 4

| Signal Level Relative to Full Scale | Transitions Standard Interface | Transitions New Interface |
|---|---|---|
| −100 Db | 1448/ms | 608/ms |
| −80 Db | 1429/ms | 574/ms |
| −60 Db | 1401/ms | 569/ms |
| −40 Db | 1451/ms | 598/ms |
| −20 Db | 1456/ms | 599/m |
| 0 Db | 701/ms | 1350/ms |

As expected, the power consumption depends on the input signal level. Table 4 lists the number of transitions that occurred on interface 76 in a millisecond using a 2 MHz clock signal. The standard interface is characterized by, on average, approximately 0.7 transitions per clock cycle. This is representative for conventional delta-sigma modulators since these modulators constantly alternate between the available codes. Using the new interface, the average number of transitions per clock cycle on interface 76 are reduced to approximately 0.3, in other words, for typical signal levels (the signal level will only occasionally exceed −20 Db of full scale), the number of transitions are advantageously reduced by a factor of approximately 2.5.

For the used technology, the present invention requires approximately 20 uA/MHz to drive interface wire 76 with a 5 pF capacitive load 70. Hence, without the encoding, transmitter's 68 current consumption would be in the order of 28 uA. When the encoding scheme is used, transmitter's 68 current consumption is reduced to approximately 14 uA, including the power needed to operate the described circuitry. The saved 14 uA constitutes more than 10% of the total current consumed by buffer 66, ADC 54, and transmitter 68. The new serial interface, therefore, represents a substantial overall improvement of the system.

Therefore, from the foregoing description of the present invention, this invention substantially reduces the power consumption of a serial interface. The transmitter's 68 power consumption may be reduced by as much as a factor of two. The savings are a substantial fraction of the system's overall power consumption. The reduced power consumption translates into longer battery life, which is a substantial advantage for hearing aids and other portable applications. The interface is self-synchronizing, which makes it robust to bit errors and easy to use.

While the above description contains many specificities, these should not be construed as limitations of the scope of the present invention, but rather as an exemplification of preferred embodiments thereof. Many other variations are possible. For example, a different set of codes may be used to represent transitions in the state machines, the delta-sigma modulator may have more or less than 4 quantization levels, the delta-sigma modulator's quantization levels may have a different set of values, for example, ±1 and ±3, ±1 and ±32, and the like, the interface may be used in other medical applications with other types of transducers, in cellular phones, for audio and non-audio equipment, with or without a shielding environment, and in many other applications such as, for example, electronic tape measures. Those who are skilled in the art will understand that the state machines used to illustrate a preferred embodiment of this invention is merely and example of such systems, they can be designed in a great number of ways. The underlying technology can be, for example, CMOS, BJT, BiCMOS or any other current or future technology suitable for the implementation of integrated circuits. In fact, this invention should not be construed as limited to electric circuit, future signal processing platforms, possibly biochemical, may take advantage of such encoding schemes for data communications. Accordingly, the scope of the invention should be determined not by the described embodiments, but by the appended claims and their legal equivalents.

What is claimed is:

1. An encoder, comprising:

an input adapted to receive a digital input data stream;

a conversion circuit adapted to convert said digital input data stream into an output data stream composed of at least 2-bit codes, wherein said conversion circuit generate said codes as a function of transitions of said input data stream, wherein each bit of said code have the same voltage level when said digital input data stream alternates between two predefined numeric values; and said output data stream being composed of codes having each 2 bits of resolution.

2. An encoder, comprising:

an input adapted to receive a digital input data stream;

a conversion circuit adapted to convert said digital input data stream into an output data stream composed of at least 2-bit codes, wherein said conversion circuit generates said codes as a function of transitions of said input data stream, wherein each bit of said codes have the same voltage level when said digital input stream alternates between two predefined numeric values; and wherein said digital input data stream is composed of values proportional to values chosen from the set of minus eight, minus one, plus one, and plus eight.

3. An encoder, comprising:

an input adapted to receive a digital input data stream;

a conversion circuit adapted to convert said digital input data stream input an output data stream composed of at least 2-bit codes, wherein said conversion circuit generates said codes as a function of transitions of said input data stream, wherein each bit of said codes have the same voltage level when said digital input data stream alternates between two predefined numeric values; and wherein said codes are represented by 00, 01, 10 and 11.

4. An encoder, comprising:

an input adapted to receive a digital input data stream;

a conversion circuit adapted to convert said digital input data stream input an output data stream composed of at least 2-bit codes, wherein said conversion circuit generates said codes as a function of transitions of said input data stream, wherein each bit of said codes have the same voltage level when said digital input data stream alternates between two predefined numeric values; and wherein said conversion circuit compares a previous value of said digital input data stream with a most recent value of said digital input data stream to generate said input data stream.

5. An encoder, comprising:

an input adapted to receive a digital input data stream;

a conversion circuit adapted to convert said digital input data stream input an output data stream composed of at least 2-bit codes, wherein said conversion circuit generates said codes as a function of transitions of said input data stream, wherein each bit of said codes have the same voltage level when said digital input data stream alternates between two predefined numeric values; and wherein said conversion circuit provides said output data stream such that the polarity of said output data stream is ascertainable by a receiver.

6. An encoder, comprising:

an input adapted to receive digital input data stream;

a conversion circuit adapted to convert said digital input data stream into an output data stream composed of at least 2-bit codes, wherein said conversion circuit generates said codes as a function of transitions of said input data stream, wherein each bit of said code have the same voltage level when said digital input data stream alternates between two predefined numeric values; and wherein a predetermined code is generated every time the input data stream comprises a predetermined numeric value.

7. The encoder as specified in claim 6 wherein said predetermined numeric value is a representative of the largest absolute value that can be represented by said input data stream.

8. An encoder, comprising:

an input adapted to receive a digital input data stream;

a conversion circuit adapted to convert said digital input data stream into an output data stream composed of at least 2-bit codes, wherein said conversion circuit generates said codes as a function of transitions of said input data stream, wherein each bit of said code have the same voltage level when said digital input data stream alternates between two predefined numeric values; and wherein said conversion circuit is a state machine;

wherein said state machine starts at a predetermined state at initialization of said digital input serial data stream; and wherein said conversion circuit synchronizes everytime said output data stream as a predetermined state.

9. An encoder, comprising:

an input adapted to receive a input digital data stream;

a conversion circuit adapted to convert said input digital data stream into an output data stream composed of at least 2-bit codes, wherein said conversion circuit generates said codes as a function of transitions of said input digital data stream, wherein each bit of said codes have the same voltage level when said input digital data stream alternates between two predefined numeric values;

an ADC generating said input digital data stream; and wherein said output data stream is provided at a rate substantially higher than twice the signal bandwidth of said ADC.

10. The encoder as specified in claim 9 wherein said ADC converter comprises a delta-sigma modulator.

11. The encoder as specified in claim 9 wherein said ADC is disposed with a hearing aid.

12. A method of encoding a first stream of digital signal data words, comprising the steps of:

receiving and storing a most recent value of said first stream of digital date words;

receiving and storing a previous value of said first stream of digital data words;

comparing said most recent value and said previous value of said stream of digital data words to create a second data stream having at least 2-bit words;

providing the words in said second data stream in a serial representation;

transmitting said serial representation on a single wire interface;

synchronizing a transmission of said serial representation with edges of a received clock signal;

composing said second s am of digital data words in two-bit digital data words; and generating said first stream of digital data by analog-to-digital conversion of an audio signal.

13. The method of claim 12 wherein the analog-to-digital conversion of an audio signal comprises the step of using a delta-sigma modulator.

14. The method of claim 12 wherein said delta-sigma modulator is disposed inside a microphone.

15. The method of claim 14 wherein said microphone is disposed in a hearing aid.

16. A method of operating an encoder, comprising the steps of:

receiving a digital input serial data stream;

converting said digital input serial data stream to at least a 2-bit code, wherein said code is generated as a function of a transistion of said digital input serial data stream, and also as a function of a lack of a transition of said digital input serial data stream, wherein each bit of said code has the same voltage level when said digital input signal data stream transitions; and wherein said predetermined code is digital 11.

17. A method of operating an encoder, comprising the steps of:

receiving a digital input serial data stream;

converting said digital input serial data stream to at least a 2-bit code, wherein said code is generated as a function of a transition of said digital input serial data stream, and also as a function of a lack of a transition of said digital input serial data stream, wherein each bit of said code has the same voltage level when said digital input serial data stream transitions; and wherein said predetermined code is digital 00.

18. A method of operating an encoder, comprising the steps of:

receiving a digital input serial data stream;

converting said digital input serial data stream to at least a 2-bit code, wherein said code is generated as a function of a transition of said digital input serial data stream, and also as a function of a lack of a transition of said digital input serial data stream, wherein each bit of said code has the same voltage level when said digital input serial data stream transitions; and wherein said code is representative of a digital code 00, 01, 10 and 11.

19. A method of operating an encoder, comprising the steps of:

receiving a digital input serial data stream;

converting by a conversion circuit said digital input serial data stream to at least a 2-bit code, wherein said code is generated as a function of a transition of said digital input serial data stream, and also as a function of a lack of a transition of said digital input serial data stream, wherein each bit of said code has the same voltage level when said digital input serial data stream transitions; and wherein said conversion circuit provides said output data stream such that a phase of said output data stream is ascertainable by a receiver.

20. The method as specified in claim 19 wherein said output data stream is set by the conversion circuit at a first predetermined code to establish synchronization at initialization of said digital input serial data stream.

21. The method as specified in claim 20 wherein a phase of said output data stream is ascertainable upon a reset event.

22. A method of operating an encoder, comprising the steps of:

receiving a digital input serial data stream;

converting by a conversion circuit of a state machine said digital input serial data stream to at least a 2-bit code, wherein said code is generated as a function of a transition of said digital input serial data stream, and also a function of a lack of a transition of said digital input serial data stream, wherein each bit of said code has the same voltage level when said digital input serial data stream transitions;

wherein said state machine starts at a predetermined state at initialization of said digital input serial data stream; and wherein said conversion circuit synchronizes everytime said output data stream has a predetermined state.

23. A method of operating an encoder, comprising the steps of:

receiving a digital input serial data stream;

converting said digital input serial data stream to at least a 2-bit code comprising an output data stream, wherein said code is generated as a function of a transition of said digital input serial data stream, and also a function of a lack of a transition of said digital input serial data stream, wherein each bit of said code has the same voltage level when said digital input serial data stream transitions;

wherein said output data stream comprises a sequence of codes at a rate substantially higher than the Nyquist rate.

24. A method of operating an encoder, comprising the steps of:

receiving a input digital serial data stream;

converting said input digital serial data stream to at least a 2-bit code, wherein said code is generated as a function of a transition of said input digital serial data stream, and also as a function of a lack of a transition of said input digital serial data stream, wherein each bit of said code has the same voltage level when said input digital serial data stream transitions;

using an ADC to generate said input digital serial data stream and wherein said ADC converter comprises a delta-sigma modulator.

25. A method of operating an encoder, comprising the steps of:

receiving a digital input serial data stream;

converting said digital input serial data stream to at least a 2-bit code comprising an output data stream, wherein said de is generated as a function of a transition of said digital input serial data stream, and also as a function of a lack of a transition of said digital input serial data stream, wherein each bit of said code has the same voltage level when said digital input serial data stream transitions;

a receiving circuit converting said output data stream to a serial data stream.

26. A method of operating an encoder, comprising the steps of:

receiving a digital input serial data stream;

converting said digital input serial data stream to at least a 2-bit code comprising an output data stream, wherein said code is generated as a function of a transition of said digital input serial data stream, and also as a function of a lack of a transition of said digital input serial data stream, wherein each bit of said code has the same voltage level when said digital input serial data stream transitions;

wherein said digital input serial data stream is digitized signals from a microphone.

27. The method as specified in claim 26 wherein said microphone is disposed with a hearing aid.

28. The encoder of claim 1, wherein said conversion circuit adapted to provide said output data stream serially on a single conductor.

29. The method as specified in claim 19 wherein said conversion circuit provides said output data stream a single conductor.

30. The method as specified in claim 19 wherein said conversion circuit compares a previous value of said digital input serial data stream with a most recent value of said digital input serial data stream to generate said output data stream.

* * * * *